(12) United States Patent
Zenith et al.

(10) Patent No.: US 11,239,481 B2
(45) Date of Patent: Feb. 1, 2022

(54) CONTROL OF AN ELECTROCHEMICAL DEVICE WITH INTEGRATED DIAGNOSTICS, PROGNOSTICS AND LIFETIME MANAGEMENT

(71) Applicants: STIFTELSEN SINTEF, Trondheim (NO); ELECTRICITE DE FRANCE, Paris (FR); ECOLE NATIONALE SUPERIEURE DE MECANIQUE ET DES MICROTECHNIQUES, Besancon (FR); UNIVERSITY OF SPLIT, FACULTY OF ELECTRICAL ENGINEERING, MECHANICAL ENGINEERING AND NAVAL, Split (HR); ZENTRUM FUR SONNENENERGIE-UND WASSERSTOFF-FORSCHUNG BADEN-WURTTEMBERG, Stuttgart (DE); DANTHERM POWER A.S, Hobro (DK)

(72) Inventors: Federico Zenith, Trondheim (NO); Johannes Tjonnas, Trondheim (NO); Ivar J. Halvorsen, Trondheim (NO); Angelo Esposito, Karlsruhe (DE); Rafael Gouriveau, Besancon (FR); Elodie Lechartier, Besancon (FR);

(Continued)

(73) Assignees: STIFTELSEN SINTEF, Trondheim (NO); ELECTRICITE DE FRANCE, Paris (FR); ECOLE NATIONALE SUPERIEURE DE MECANIQUE ET DES MICROTECHNIQUES, Besancon (FR); UNIVERSITY OF SPLIT, FACULTY OF ELECTRICAL ENGINEERING, MECHANICAL ENGINEERING AND NAVAL ARCHITECTURE, Split (HR); ZENTRUM FUR SONNENENERGIE- UND WASSERSTOFF-FORSCHUNG BADEN-WURTTEMBERG, Stuttgart (DE); DANTHERM POWER A.S, Hobbo (DK)

( * ) Notice: Subject to any disclaimer, the term of this patent is extended or adjusted under 35 U.S.C. 154(b) by 853 days.

(21) Appl. No.: 15/518,690

(22) PCT Filed: Oct. 16, 2015

(86) PCT No.: PCT/EP2015/073988
§ 371 (c)(1),
(2) Date: Apr. 12, 2017

(87) PCT Pub. No.: WO2016/059203
PCT Pub. Date: Apr. 21, 2016

(65) Prior Publication Data
US 2017/0237096 A1    Aug. 17, 2017

Related U.S. Application Data

(60) Provisional application No. 62/065,289, filed on Oct. 17, 2014, provisional application No. 62/066,067, filed on Oct. 20, 2014.

(51) Int. Cl.
*H01M 8/04992* (2016.01)
*H01M 8/0438* (2016.01)
(Continued)

(52) U.S. Cl.
CPC ... *H01M 8/04992* (2013.01); *H01M 8/04298* (2013.01); *H01M 8/04395* (2013.01);
(Continued)

(58) Field of Classification Search
None
See application file for complete search history.

(56) References Cited

U.S. PATENT DOCUMENTS 5,945,229 A * 8/1999 Meltser ............. H01M 8/04089
429/431

(Continued)

FOREIGN PATENT DOCUMENTS

WO    2014/098802 A1    6/2014

OTHER PUBLICATIONS

Zenith et al., "Control structure of a micro combined heat and power fuel-cell system for lifetime maximisation," 2014 IEEE Vehicle Power and Propulsion Conference (VPPC), Oct. 27, 2014, 6 pages.

*Primary Examiner* — Brent A. Fairbanks
(74) *Attorney, Agent, or Firm* — Faegre Drinker Biddle & Reath LLP

(57) ABSTRACT

A method for controlling the operation of an electrochemical device having at least one operating organ, comprising the
(Continued)

steps of: receiving measurements related to the operation of the electrochemical device, and estimating at least diagnostics data based on said measurements, estimating prognostics data based on said diagnostics data and providing operation instructions to control said operating organ of the electrochemical device, said operation instructions being optimized with respect to said estimated diagnostics and prognostics data.

11 Claims, 7 Drawing Sheets

(72) Inventors: Frano Barbir, Split (HR); Dario Bezmalinovic, Split (HR); Merle Klages, Ulm (DE); Joachim Scholta, Nersingen (DE); Alan Menard, Hobro (DK); Thomas Pedersen, Aalborg SV (DK); Marie-Cecile Pera, Belfort (FR); Daniel Hissel, Ronchamp (FR); Christoph Kandler, Kronau (DE); Philippe Mocoteguy, Lauterbourg (FR)

(51) Int. Cl.
*H01M 8/04492* (2016.01)
*H01M 8/04537* (2016.01)
*H01M 8/04298* (2016.01)
*H01M 8/04746* (2016.01)
*G01R 31/367* (2019.01)
*G01R 31/392* (2019.01)

(52) U.S. Cl.
CPC ... *H01M 8/04507* (2013.01); *H01M 8/04552* (2013.01); *H01M 8/04746* (2013.01)

(56) References Cited

U.S. PATENT DOCUMENTS

| | | | |
|---|---|---|---|
| 2006/0046105 A1* | 3/2006 | Binder | H01M 16/003 429/430 |
| 2006/0263651 A1* | 11/2006 | Fagley | H01M 8/04723 429/413 |
| 2007/0259256 A1* | 11/2007 | Le Canut | H01M 8/04089 429/90 |
| 2008/0050619 A1* | 2/2008 | Lai | H01M 8/04291 429/413 |
| 2008/0152968 A1 | 6/2008 | Zhou et al. | |
| 2010/0261079 A1 | 10/2010 | Kells et al. | |
| 2010/0286939 A1 | 11/2010 | Oh et al. | |
| 2012/0100445 A1* | 4/2012 | Naganuma | H01M 8/04552 429/414 |
| 2013/0078543 A1* | 3/2013 | Chiba | H01M 8/04029 429/437 |
| 2015/0346065 A1* | 12/2015 | Ramaswamy | G05B 23/0235 702/183 |

* cited by examiner

CONTROL OF AN ELECTROCHEMICAL DEVICE WITH INTEGRATED DIAGNOSTICS, PROGNOSTICS AND LIFETIME MANAGEMENT

CROSS-REFERENCE TO RELATED APPLICATIONS

This application is the U.S. national phase of the International Patent Application No. PCT/EP2015/073988 filed Oct. 16, 2015, which claims the priority benefit of U.S. Provisional Patent Application No. 62/065,289 filed Oct. 17, 2014, and U.S. Provisional Patent Application No. 62/066,067, filed Oct. 20, 2014, the contents being incorporated herein by reference.

BACKGROUND

Field

The invention relates to the control of electrochemical devices such as fuel cells, and the like.

Description of the Related Art

More particularly, the invention relates to a method for maximising the lifetime and the performance of such electrochemical devices.

Currently there are various devices known as "electrochemical" devices, meaning that they rely on the conversion of chemical energy into electrical energy or vice versa.

A first category of this type of device concerns devices which convert chemical energy into electrical energy in order to:
supply this energy to any connected electrical device, or store it for a later use.

Examples of such devices are batteries, fuel cells, or super-capacitors.

A second category of this type of device is related to devices which use various methods relying on electricity to perform chemical reactions, or to separate products or reagents.

Such devices commonly use "electrochemical" methods such as electrodeposition, electrical discharge machining, electroflotation or electrodialysis.

In operation, these devices can drift to/or operate in abnormal/faulty conditions. These conditions can induce problems of quality (e.g. unconformable products), efficiency (increased operational costs) but also safety (in case of failure). In addition, certain incidents such as failures in controlling certain parameters of the electrochemical method used (interruption in the reagent supply, poor management of reaction products and sub-products), poisoning of the medium, or failure of a component or a module for example, can occur during their operation.

These events have to be detected and their impact on lifetime or on the quality of the service provided to the customer has to be estimated. For that purpose, Prognostics and Health Management (PHM) is used for calculating an item's Remaining Useful Life (RUL), having estimated its current condition.

Prognostics focus on predicting the future (how long the item will last from now), whereas diagnostics focus on explaining the past (why the item is in its current condition).

Finally, to prevent the occurrence of faulty conditions or failure and their impact on lifetime, specific control methods are needed for detecting them, estimate their impact on lifetime and correcting them for maximizing their lifetime in order to keep the service delivered to the customer.

Up to now, these devices are controlled by various forms of regulatory control whose main objective is to maintain a system at a specified condition, or steer the system towards it.

This condition may be identified by readily measurable variables, such as the temperature or the voltage level.

The different tools that are used for estimating State of Health (SoH) and lifetime are usually associated with a remote control that gives (off-line) information to an operator.

Such control is generally simple to implement, but does nothing beyond running the device within specified parameters.

The invention aims to improve that situation.

SUMMARY

The present invention proposes a tool which fully integrates a self-regulated system that allows simultaneously estimating the SoH and the lifetime and adjusts on-line the operating parameters/conditions for optimising the performance of the electrochemical device, while maximizing its lifetime, in compliance with the needs and/or the requests of the end-user.

To that end, the present invention aims at a method for controlling the operation of an electrochemical device having at least one operating organ, comprising the steps of:
receiving measurements related to the operation of the electrochemical device, and estimating at least diagnostics data based on said measurements.

More particularly, the method further comprises the steps of:
estimating prognostics data based on said diagnostics data and providing operation instructions to control said operating organ of the electrochemical device, said operation instructions being optimized with respect to said estimated diagnostics and prognostics data.

In a particular embodiment, said diagnostics data include at least data of a current state of health of the electrochemical device, including an assessment of a possible degradation of the electrochemical device, and the prognostics data include at least an estimation of a remaining useful life time of the electrochemical device.

In an embodiment, the operating organ can be controlled so as to lengthen the remaining useful life time of the electrochemical device.

The method can further comprise the steps of detecting a near end of the remaining useful life time of the electrochemical device, and generating an alarm signal if said remaining useful life time is below a predetermined threshold (so as to warn a user for example).

The method can further comprise the steps of detecting a near end of the remaining useful life time of the electrochemical device, and instructing said operating organ with modified nominal operation parameters so as to use the electrochemical device with said modified nominal operation parameters, in view of lengthening said remaining useful life time.

In a possible embodiment, said diagnostics data can include reversible disruption data and said operating instructions are based at least on said reversible disruption data so as to counteract current reversible disruption.

In a possible embodiment, each occurrence of determining said operating instructions on the basis of reversible disruption data is stored in a memory, and said prognostics data are estimated further on the basis of a number of occurrences of counteracted reversible disruptions.

In a possible embodiment, a feedback of operation instructions data is provided to estimate the prognostics data and said prognostics data are estimated further on the basis of said operating instructions.

In a possible embodiment, said prognostics data can be estimated further on the basis of expected future environment data.

In an embodiment where the aforesaid electrochemical device comprises at least one fuel cell having a fuel canal (a fuel like hydrogen or a reformate gas, for example), said measurements include a monitoring of variations of voltage provided by the fuel cell, and said operating organ comprises an air bleed inlet in the fuel canal so as to evacuate contaminant (such as carbon monoxide or hydrogen sulphur, for example) from the fuel canal if a decrease of an average voltage value is observed from said measurements.

In an embodiment where the aforesaid electrochemical device comprises at least one fuel cell having an oxidant canal (an oxidant like oxygen, air or any mixture of them, for example), said measurements include a pressure loss measurement in said oxidant canal, sensed by one or several sensors provided in said oxidant canal, and said operating organ comprises a moisture controller in said oxidant canal so as to:
  dry the oxidant canal if pressure loss is detected as being higher than a first threshold, and
  humidify the oxidant canal if pressure loss is detected as being lower than a second threshold.

In an embodiment where the aforesaid electrochemical device comprises at least one fuel cell having a fuel canal, said measurements include further a monitoring of variations of voltage provided by the fuel cell, and said operating organ comprises an air bleed inlet in the fuel canal so as to evacuate a contaminant (such as carbon monoxide for example) from the fuel canal if a decrease of an average voltage value is observed from said measurements, while said pressure loss is detected as being between said first and second thresholds.

The present invention aims further at a computer program comprising instructions to implement the method presented above, when said instructions are run by a computer processor. FIG. 2A commented below can correspond to a general algorithm of such a computer program, in an example of embodiment. The invention furthermore aims at a non-transitory computer medium storage storing instructions of such a computer program.

The invention further aims at a computer circuit unit comprising at least an input interface to receive measurements, a processor and at least a memory unit to perform the method presented above, and an output interface to provide operation instructions to control at least one operating organ of an electrochemical device as defined above. FIG. 2B shows an exemplary embodiment of such a computer circuit unit.

The present invention aims also at an electrochemical device including at least one sensor connected to the computer circuit unit as defined above, and at least one operating organ connected to that computer circuit unit to operate the electrochemical device on the basis of operating instructions provided by the computer circuit unit, as shown of FIG. 2B commented below.

The provisions of the invention enable then to maximize the lifetime of an electrochemical device during its usage, to employ diagnostic and prognostic techniques to determine its state of health and its remaining useful lifetime, and to continually adapt its operating condition to minimize degradation phenomena.

In the particular but not exclusive case of proton exchange membrane fuel cells (PEMFC), studies have been conducted in order to understand the degradation mechanisms and improve reliability and service life. In an embodiment of the present invention, a device (hardware) and/or an algorithmic method (software) are implemented to gather data, mainly from sensors installed in the fuel cell system and its vicinity.

On the basis of these measurements, the device and/or method can evaluate the presence of disrupting conditions, such as:
  excessive water production ("flooding")
  insufficient water production ("drying")
  poisoning of the catalyst, for example by carbon monoxide
  Or any other reversible degradation phenomenon.

The device and/or method shall then enact appropriate countermeasures to ameliorate the identified disruptive conditions and prevent or limit their occurrence before they induce permanent degradation.

In the same embodiment, the data gathered by the device and/or method can be used to estimate the degree of irreversible performance degradation of the fuel cells, be it deterministically or stochastically, for various pathways of degradation such as:
  Loss of electrochemically active area in the cathode and/or the anode.
  Mechanical or chemical wear of the membrane and/or a gas diffusion layer
  Loss of hydrophobicity in a gas-diffusion layer
  Or any other irreversible degradation phenomenon The device and/or method can then perform an optimisation, based on the current state of degradation, and set an optimal operating point or trajectory in time for the control variables of the fuel cell, such as its temperature, reactant and air flows, and any other variable available for optimisation in the specific fuel cell.

In an exemplary embodiment of the invention, the device and/or method can record sensor readings and store them in a memory (either on the same device or in a remote memory through a wireless connection for example), to later perform the steps described above employing sensor data history.

In another embodiment of the present invention, the device and/or method perform only the estimation of possible irreversible degradation and the optimisation of operating conditions, without the step of identification and counteraction of disruptive conditions.

In an exemplary embodiment of the invention, the optimisation is carried out by calculating the RUL of the fuel cells with prognostic methods, and employing it either alone or together with other inputs to provide an appropriate objective function.

In an alternative or complementary embodiment of the invention, the presence of catalyst poison carbon monoxide on the anode is determined by periodically stepping up the air flow into the anodic side, known as "air bleed", preferably from 0.8% of the anodic flow with gradual steps up to 4%, and observing whether a changed in cell voltage occurs at each step. Depending on the result, the increased air bleed may be maintained or rolled back to its previous value. The air bleed may routinely be reduced, e.g. when no poisoning by carbon monoxide has been detected for a prolonged time.

In an alternative or complementary embodiment of the invention, the loss of hydrophobicity in the gas diffusion layer is estimated by a small, cyclic change of current in the fuel cell and simultaneous measurement of the voltage. The shape of the voltage transient is used to determine how close the system is to a mass-transport limit, and thereby whether the hydrophobicity of the gas diffusion layer has been reduced.

In an alternative or complementary embodiment of the invention, flooding conditions are detected by measuring the noise of the fuel cell's voltage, preferably by calculating the standard deviation or alternatively with any other statistics representing variability of data. A sudden increase in voltage variability is interpreted as an index of flooding, caused by the clogging of water droplets in the fuel cell.

In an alternative or complementary embodiment of the invention, dry-out conditions are determined by observing the pressure drop of the air flow across the fuel cell in relationship with the measured flow rate. A too low pressure drop indicates the absence of droplets and sub-saturated humidity conditions, which ultimately result in dry-out of the cell and sub-optimal operation.

In an alternative or complementary embodiment of the invention, the spent fuel gas that leaves the fuel cell is reacted with air in a burner, and its temperature is monitored. A change in temperature for a given air flow indicates a reduction in residue hydrogen flow, that is taken as an indicator of hydrogen starvation.

DETAILED DESCRIPTION

Figure 1:
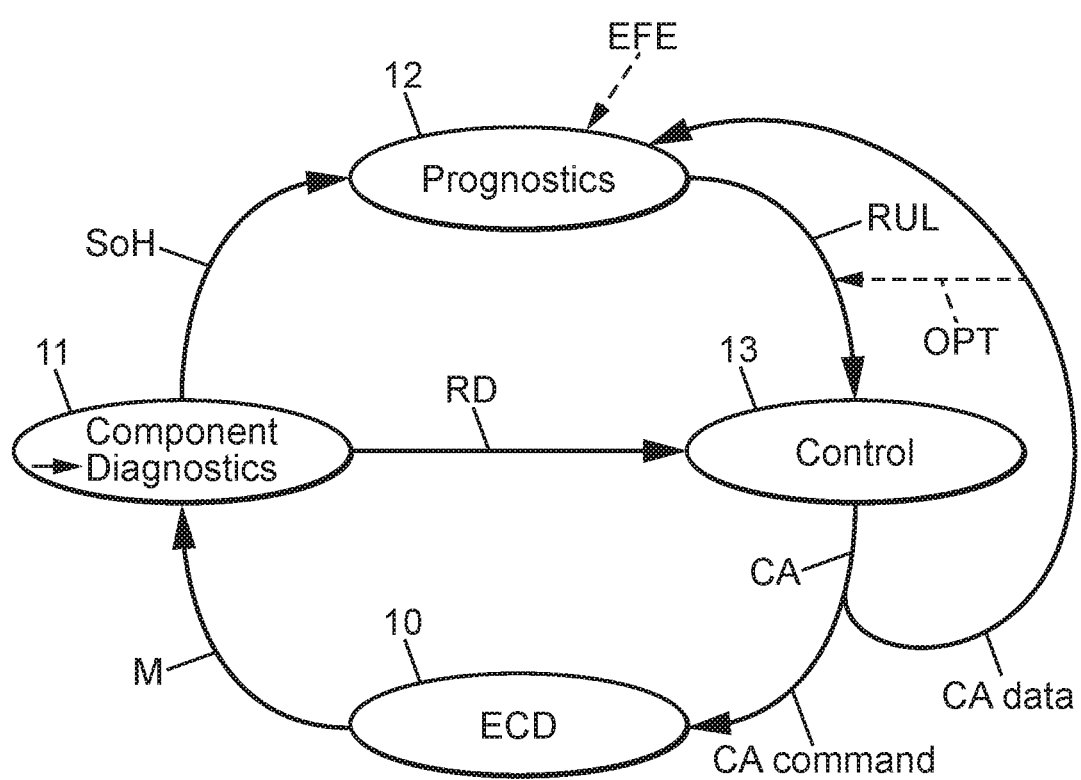
FIG. 1 illustrates the flow of information and actions in an embodiment of the invention, in the considered example of PEMFC for µ-CHP application.

Referring to FIG. 1, an electrochemical device 10 (for example a fuel cell such as a micro Combined Heat and Power system µCHP) includes one or several sensors so as to provide measurements M to a component 11 of a computer circuit unit, for:
  assessing diagnostics,
  estimating thus a State of Health SoH of the fuel cells, and identifying any reversible disruption to counteract.

Data of Reversible Disruption RD are provided further to a control component 13 of the computer circuit unit.

The State of Health SoH is used by a prognostics component 12 of the computer circuit unit, together with information about the Expected Future Environment EFE of the system. Data of the Expected Future Environment EFE are therefore data which can be input in the computer circuit unit.

The control component 13 estimates a Control Action (CA). The prognostics component 12 receives control action data CA and calculates the Remaining Useful Life (RUL).

More particularly, the control component 13 can generate a control action command CA that in part compensates the Reversible Disruption identified by the diagnostics component 11, and in part can be optimised (dashed arrow OPT), interacting with the prognostics component 12, to maximise the Remaining Useful Life (RUL) or a function thereof. Control Action data CA are then fed to the µCHP system to implement with its low-level internal regulatory system (LLIRS as referenced in FIG. 2B commented below).

Figure 2A:
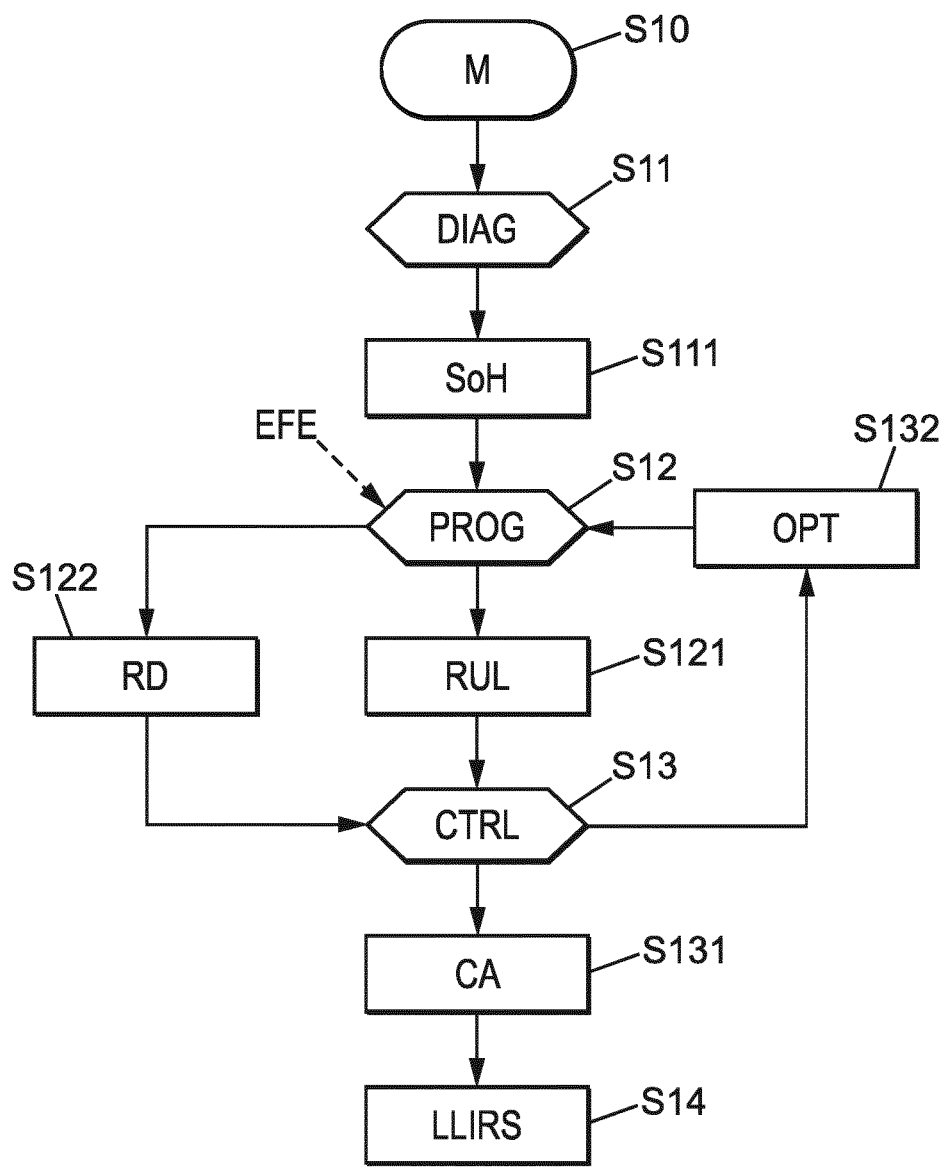
FIG. 2A illustrates a flowchart of an algorithmic method according to an embodiment of the invention.

Referring now to FIG. 2A, in a first step S10, measurements M are acquired and sent to the diagnostics component at step S11. Then, a state of health SoH of the electrochemical device can be estimated in step S111. The state of health SoH can be transmitted then to a prognostics component PROG at step S12. The prognostics assessment can be based on the state of health SoH, but also on an expected future environment EFE (such as for example a nominal voltage or current to be provided). On that basis, the remaining useful life RUL of the electrochemical device can be assessed in step S121, and further data related to reversible disruption RD can be transmitted to a control component in step S13. The aforesaid control component CTRL can elaborate then control commands CA in step S131 so as to operate the electrochemical device with respect to these control commands CA. To that end, the control commands CA can be provided in step S14 to a low-level internal regulatory system LLRIS which is usually provided in electrochemical devices.

Furthermore, a feedback loop is provided so as to optimize in step S132 the estimation of the prognostics based on possible new control commands.

Figure 2B:
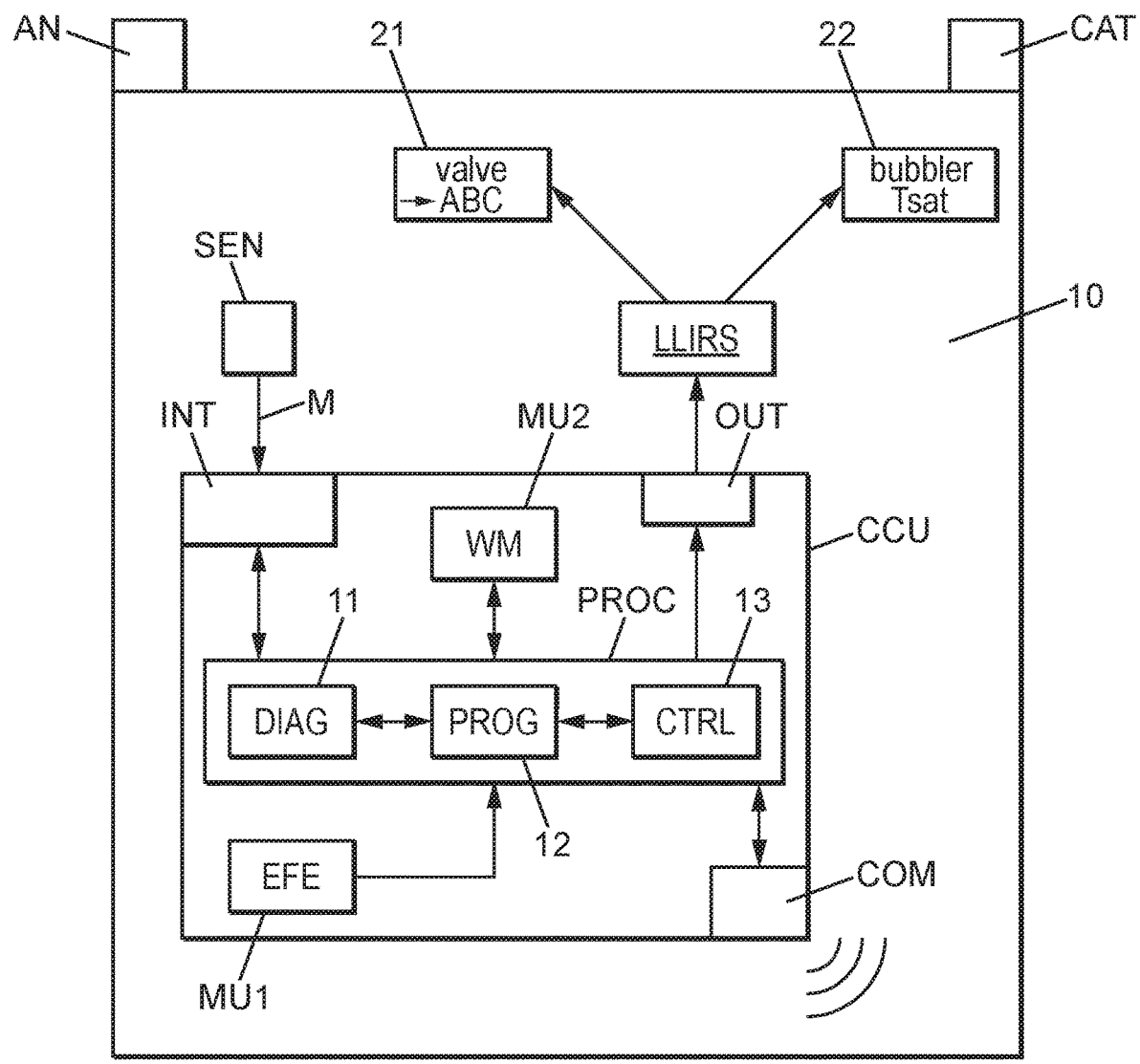
FIG. 2B illustrates a internal device provided in an electrochemical system (such as a fuel cell) to perform the method of FIG. 2A in an exemplary embodiment.

Referring now to FIG. 2B, the electrochemical device 10 comprises an anode AN, a cathode CAT, and further a low-level regulatory system LLRIS, so as to control current and/or voltage provided by the electrochemical device. More particularly, the electrochemical device 10 according to the invention further comprises a computer circuit unit CCU, connected to a sensor unit SEN.

The sensor unit SEN can include sensors, for example for:
  measuring the voltage which is provided by the electrochemical device (voltage value and possibly voltage variations),
  measuring preferably pressure at the input and the output of a canal (such as for example the oxygen canal of a fuel cell, so as to measure a pressure loss of oxygen due to moisture in the canal),
  possibly but not mandatorily, measuring concentration of carbon monoxide CO (usually in the hydrogen canal of a fuel cell),
  and for any other possible measurements.

The computer circuit unit CCU includes:
  an input interface INT to receive measurements M from the sensor unit SEN;
  a processor PROC for running instructions of a computer program according to the present invention, and including more particularly computer components as described above: diagnostics component 11, prognostics component 12, and control component 13;
  a memory unit MU2 including for example a working memory WM which stores the instructions of the computer program according to the invention, and possibly any other data (temporarily, for example for the program run's sake, or permanently, for example for storing data related to incidents during the operation of the electrochemical device: dryness or flooding of the oxygen canal, CO contamination of the hydrogen canal, etc.);

possibly a memory unit MU1 (which can be the same as memory unit MU2) having for example an input to store data such as the aforesaid expected future environment EFE;

at least one output OUT to send control signals so as to command the low-level regulatory system LLRIS, the low-level regulatory system LLRIS being further connected to one or several inlet valves 21 (so as to inject an air bleed for example in the hydrogen canal to evacuate CO), or bubbler 22 (so as to dry or humidify the oxygen canal of a fuel cell for example), or any other element for controlling the operation of the electrochemical device;

a communication port COM (such as a connection to a display unit, or an antenna to send data) so as to inform a user of a near end of lifetime of the electrochemical device for example, or of any other future failure.

Figure 5:
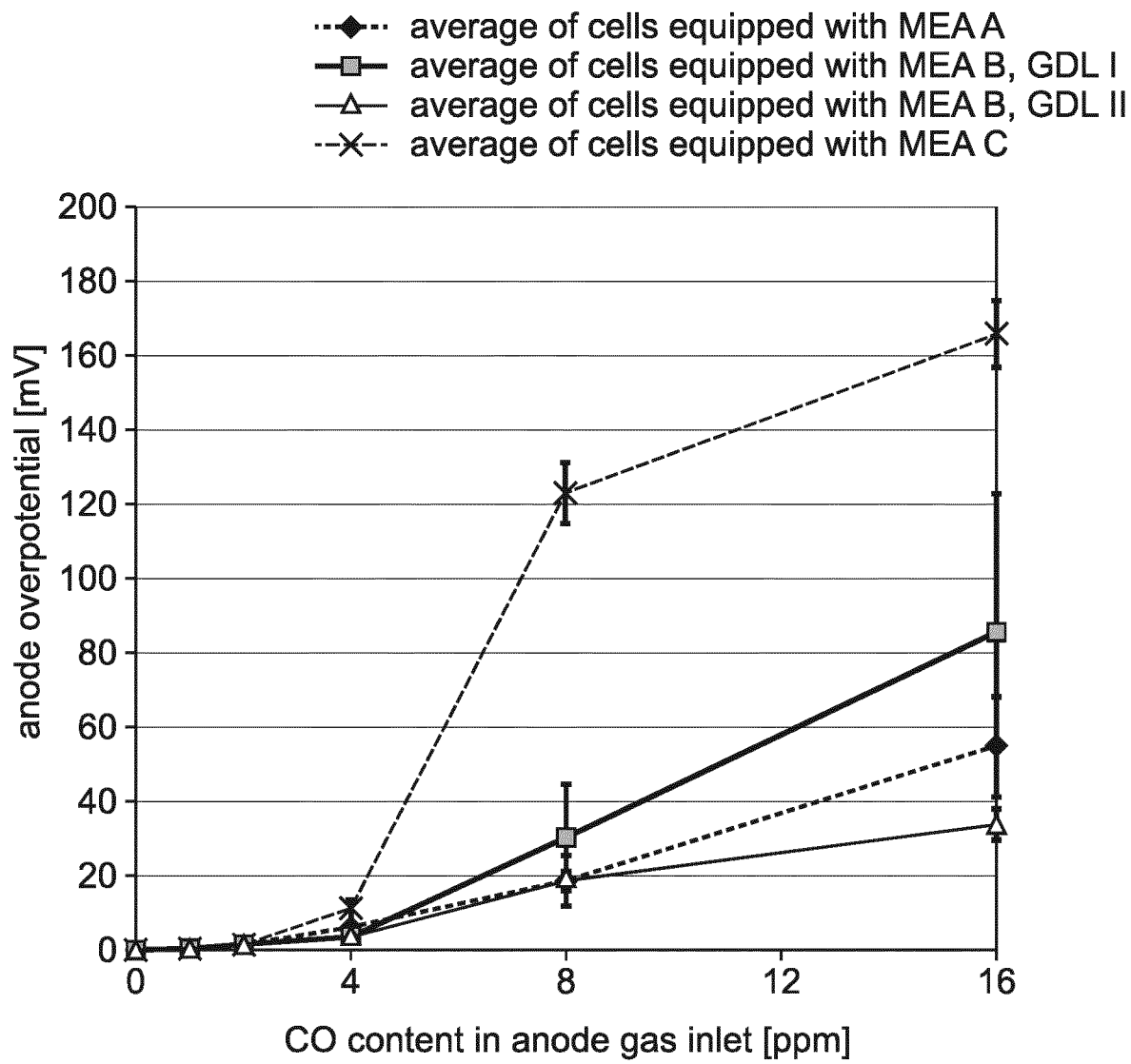
FIG. 5 illustrates the sensitivity of different types of membrane electrode assembly (MEA) on CO contamination (carbon monoxide) in a fixed set of operating conditions 2.5 hours after CO concentration set (the different sensitivity level illustrates the usefulness of an active air bleed control)

FIG. 5 shows the influence of CO contamination on different types of MEA (assembled stack of proton exchange membranes for example, or alkali anion exchange membrane, catalyst and/or flat plate electrode). There appears an anode over-potential, in any MEA case, as the CO content grows in the anode gas inlet.

Therefore, a parameter to monitor is the concentration of CO, usually in the hydrogen canal (typically in a case where a first canal of the fuel cell is provided with hydrogen as a first reactant, and, for example, a second canal is provided with oxygen as a second reactant).

Figure 3:
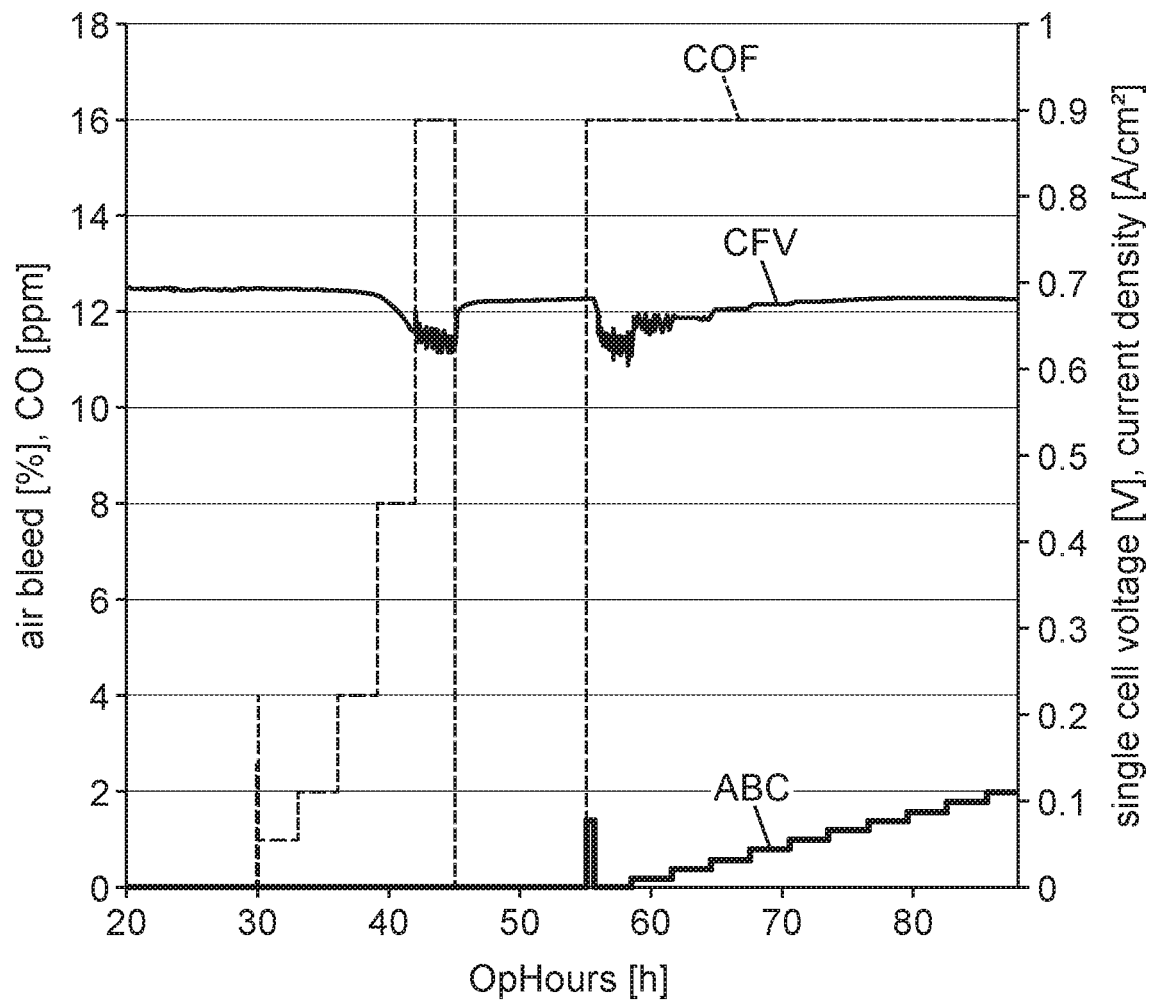
FIG. 3 illustrates the time dependence of the single cell voltage on CO concentration in the hydrogen canal of the fuel cell, and air bleed concentration.

As shown on FIG. 3, the presence of CO can be detected through voltage variations CFV (with a diminution of the average voltage as shown between 40 and 45 hours of operation in the example of FIG. 3). These unwanted problems of voltage variations can be however overcome thanks to an air bleed ABC which can be injected by steps in the hydrogen canal so as to retrieve progressively a stable voltage CFV having an expected value. In practice, the injected air reacts with CO to produce $CO_2$ which is then easily eliminated.

Therefore, the voltage variations can be monitored or sensed so as to detect CO contamination and the control of air bleed concentration ABC in the hydrogen canal (for example through an inlet valve or the like) is a way to solve the problem of such voltage variations.

More particularly, FIG. 3 illustrates the time dependence of a single cell voltage on CO concentration and air bleed concentration. Moreover, a possible control strategy is shown. Starting after 55 hours of operation, CO flow is started (COF), which is kept constant for the rest of the shown test. First a short air bleed flow (ABC) at medium concentration (1.4%) is applied, showing no observable increase in cell voltage (CFV). Then, air bleed is set to 0 (resulting in significant voltage decay) and then increased in 0.2% steps with approximatively 3 hours as hold time. At 1.4% air bleed concentration, an almost stable cell voltage is obtained. To validate this operating point, the concentration is further stepwise increased up to 2%, and then maintained.

Figure 4:
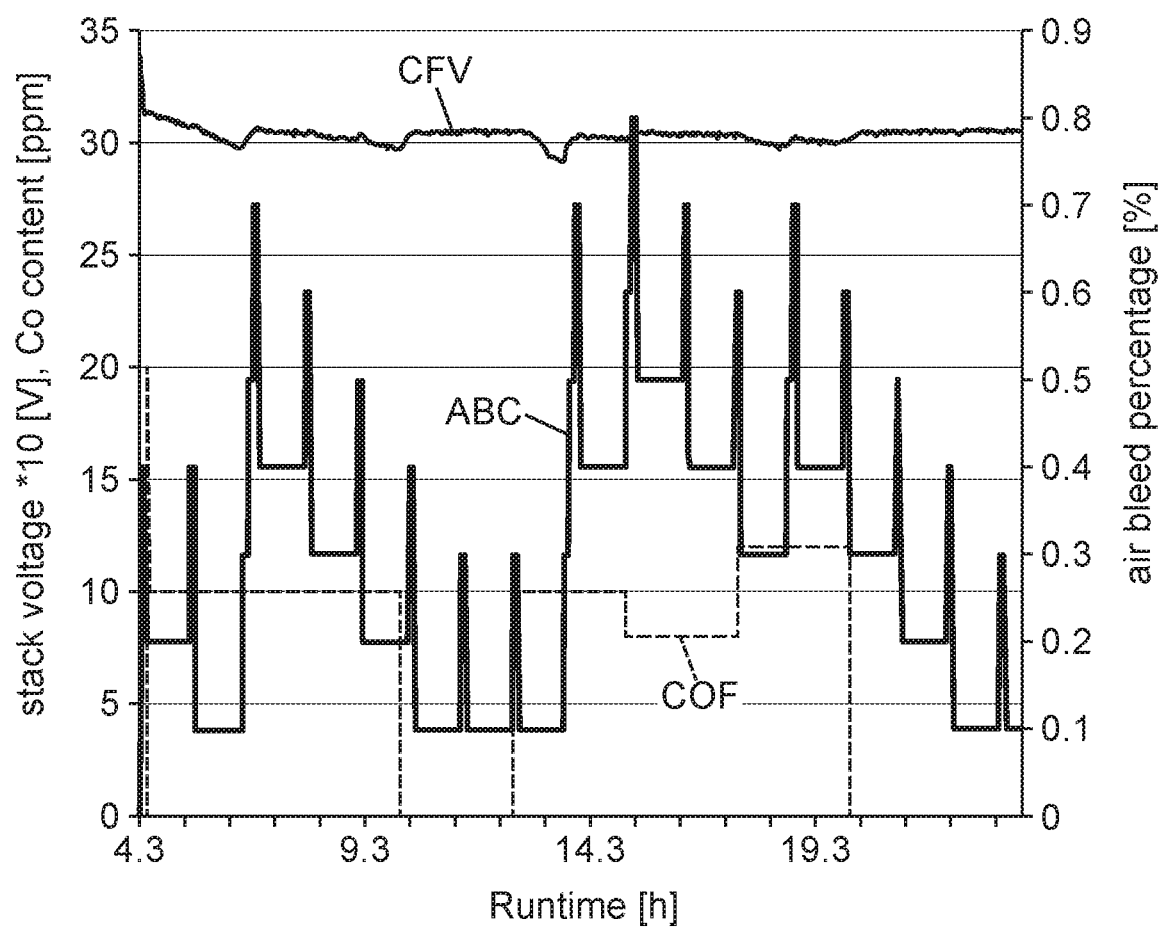
FIG. 4 illustrates the time dependence of the single cell voltage on CO concentration and air bleed concentration, under the regime of one of the proposed control strategies according to the invention.

FIG. 4 shows an example of constant regulation of the air bleed in an embodiment of the invention. In regular intervals (1 hour in the shown example), the air bleed concentration ABC is increased for e.g. 5 minutes (test phase). If no voltage increase is resulting, the air bleed will be reduced e.g. by 0.1%. The term "voltage increase" in this context may include additional derived data (e.g. "voltage noise level decrease") or other derived functions, including functional combinations of them.

If the cell voltage CFV increases during test phase, a second air bleed concentration increase will be provided for another e.g. 5 min, if the cell voltage increases, a third increase will be performed. If no significant effect (voltage increase) is achieved, the air bleed will be set from the last period (e.g. the last 1 hour) holding value upwards to a level corresponding to the number of air bleed concentration increases in the test phase.

The resulting values may be limited to upper and lower boundary values e.g. between 0.1 and 2%. Preferred test times are 0.1 min to 60 min, specially preferred times are from 1 to 15 min. Preferred hold times are from 5 min to 240 min, specially preferred hold times are from 15 to 120 min. Additional test times may be triggered by voltage decay or other derived data. The controller strategy is shown in two examples.

The control strategies are not limited to the test/hold strategies described above, but is covering any analogue strategy, where air bleed is applied, and a cell voltage (and/or derived data) are analysed, and a resulting measure (air bleed increase/decrease/no change) strategy applies.

The air bleed (e.g. hold) values adjusted by such an algorithm may be used estimate CO concentrations e.g., but not limited to a use of a calibration curve family or a mathematical function for trace back to CO concentrations and may be used in direct or converted form for system control and/or stack SoH estimation.

Figure 6:
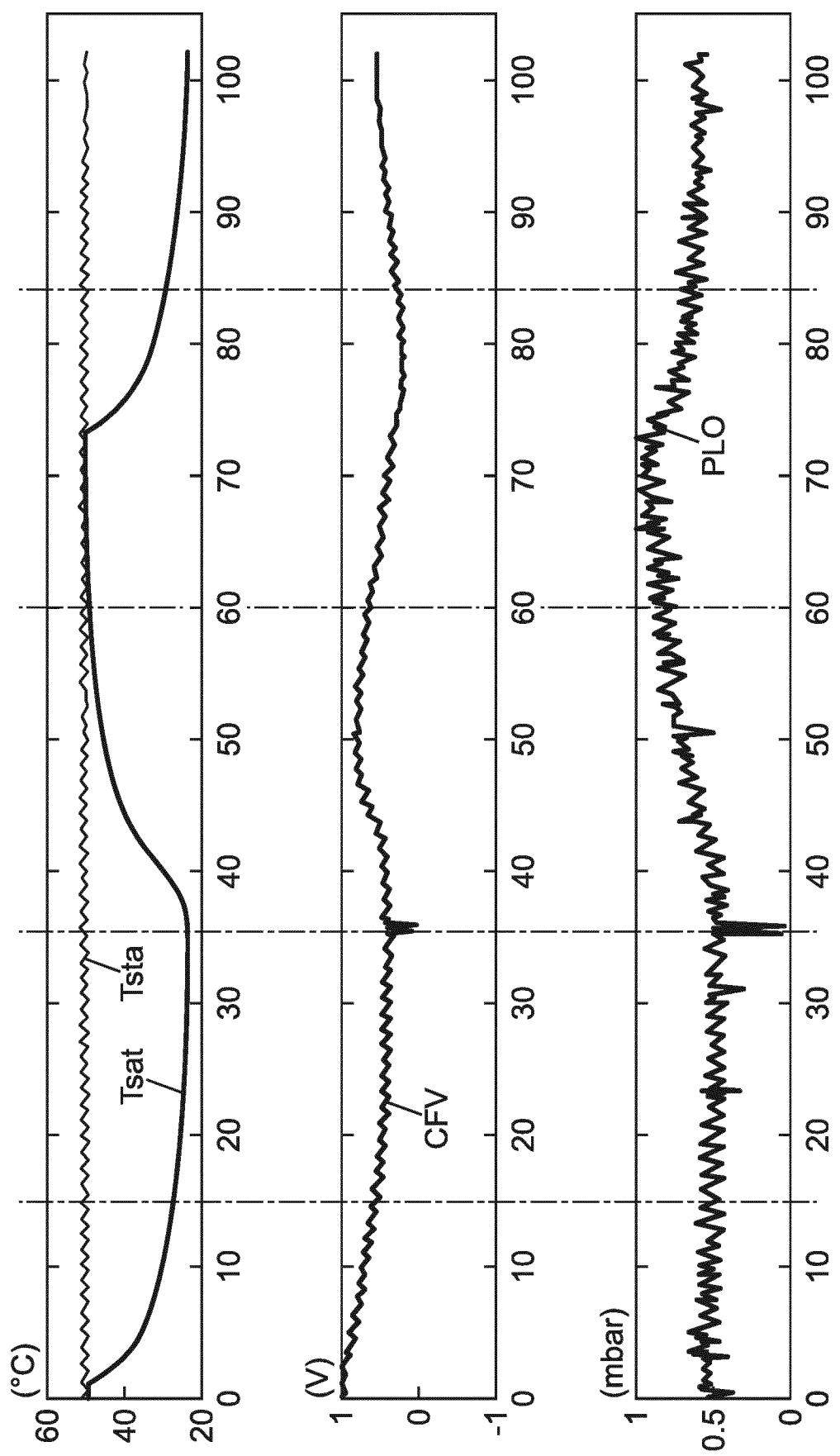
FIG. 6 shows the influence of the presence of water in the oxygen canal, on the fuel cell voltage and on the pressure loss of oxygen in the canal.

FIG. 6 shows the influence of the presence of water (liquid in the form of droplets) in the oxygen canal, on the fuel cell voltage and on the pressure loss of oxygen in the canal. More particularly, in the given example, the general stack temperature Tsta is maintained at a given level (for example 50° C.), while the temperature Tsat can be controlled for regulating the saturated vapour pressure of water in the oxygen canal (using for example to that end a bubbler or the like). Therefore, in the given example, the oxygen canal is dried, at first (left part of FIG. 6), leading to an observed diminution of the cell voltage CFV, and then, the temperature Tsat is increased so as to introduce moisture in the oxygen canal. It appears, at first, that the fuel cell voltage increases, but decreases then owing to a too large number of water drops in the oxygen canal (at the abscissa of 75).

Therefore, the voltage diminution parameter here is not sufficient to detect either dryness or flooding of the oxygen canal. Advantageously, another parameter related to pressure loss PLO in the oxygen canal can be detected. Therefore, this parameter can be sensed by using pressure sensors at the input and the output of the oxygen (and/or hydrogen) canal(s) and the sensor unit SEN of FIG. 2B can include as for an example at least such pressure sensors.

More particularly, in a possible embodiment, if voltage CFV is being detected as lower than a threshold:

while pressure loss PLO is detected as being higher than a first threshold, then temperature Tsat is decreased in the regulation so as to dry the oxygen canal and observe a voltage increase, while pressure loss PLO is detected as being lower than a second threshold, then temperature Tsat is increased in the regulation so as to humidify the oxygen canal and observe a voltage increase, while pressure loss PLO is detected as being between the first and second thresholds, then CO contamination can be suspected and air bleeding flow is increased so as to stabilize voltage to an upper average nominal value.

Moreover, it has been found that dryness and flooding in the fuel cell canal can lead to mechanical dilatations and stress which can finally damage the fuel cell, involving its end of life. In an embodiment then, each occurrence of a Tsat regulation due to dryness or flooding of the canal is stored in a memory unit (MU2 for example as shown on FIG. 2B) so as to estimate the remaining useful life of the fuel cell. As for an example, if the occurrences' number of Tsat regulation becomes higher than a predetermined threshold, then an alarm signal can be generated and sent through a communication link (a wireless link for example, as shown on FIG. 2B) by a communication interface COM, or to a display unit provided in the fuel cell armature (not shown on FIG. 2B) so as to warn a user for example of a near end of the fuel cell lifetime. In an alternative or complementary embodiment, the operating point of the fuel cell can be modified by the computer circuit unit CCU so as to operate with adapted nominal parameters (for example lower (or higher, depending on diagnostics data) hydrogen and/or oxygen flows, lower (or higher) stack temperature, etc.).

Of course, the invention is not limited to the embodiment described above as an example; it extends to other variants.

The invention can be used with fuel cells as disclosed in the detailed specification above, but more generally with any electrochemical device having parameters which can be sensed to perform diagnostics and possibly also prognostics, so as to estimate for example the remaining useful life (RUL) of an electrochemical device, and to employ regulation to maximise the RUL or a closely related function thereof.

More particularly, the invention enables to diagnose and/or detect drifts towards disruptive conditions in the electrochemical device and appropriately counteract these.

The electrochemical device can be of the type providing heat and/or power to an end-user and/or a distribution grid. It can be also of the type providing power to at least one electric motor in a vehicle and/or a robot. It can be also of the type storing energy, chemically or electrochemically. The electrochemical device can be used further to decontaminate and/or clean wastewaters or flue gases, or to concentrate and/or extract a compound from a gas and/or liquid phase.

Furthermore, in a general embodiment, sensor data history can be stored over time and employed in the calculations of the estimated lifetime (such as the parameters related to oxygen pressure loss in the example given above, but other parameters can be used alternatively or complementarily). Faulty operation can be detected by variation of externally measured variables and observation of the device voltage response, but also externally measured variables can be adjusted to a level that guarantees non faulty operation (such as the temperature Tsat).

A given degradation level can be estimated then by measuring output variables of the electrochemical device by means for example of cyclic measurements and possible changes around an operating point. That embodiment enables detection of a faulty condition, at least by statistical analysis of the device voltage measurements.

Furthermore, imminent failure/irreversible damage of the electrochemical device can be detected by changes in one or more output variables as explained above.

The invention claimed is:

1. A method for controlling an operation of an electrochemical device comprising at least one internal regulatory system, the method comprising the steps of:

receiving measurements related to the operation of the electrochemical device, and estimating at least diagnostics data based on said measurements, estimating prognostics data based on said estimated diagnostics data and providing operation instructions to control said internal regulatory system of the electrochemical device, said operation instructions being optimized with respect to said estimated diagnostics and said estimated prognostics data, wherein a feedback of operation instructions data is provided to estimate said prognostics data, and said prognostics data are estimated further on the basis of said operation instructions, and wherein said diagnostics data includes reversible disruption data, and said operating instructions are based at least on said reversible disruption data so as to counteract current reversible disruption, and each occurrence of determining said operating instructions on the basis of reversible disruption data being stored in a memory, and said prognostics data being estimated further on the basis of a number of occurrences of counteracted reversible disruptions, wherein said diagnostics data includes at least data of a current state of health of the electrochemical device, including an assessment of a possible degradation of the electrochemical device, and the prognostics data include at least an estimation of a remaining useful life time of the electrochemical device, and where said reversible disruption data are related to faulty operation of the electrochemical device and are detected by variation of at least externally measured variables including at least a voltage response of the electrochemical device.

2. The method of claim 1, wherein said internal regulatory system is controlled so as to lengthen remaining useful life time of the electrochemical device.

3. The method of claim 1, comprising the steps of determining the end of the remaining useful life time of the electrochemical device, and generating an alarm signal if said remaining useful life time is below a predetermined threshold.

4. The method of claim 1, comprising the steps of determining the end of the remaining useful life time of the electrochemical device, and instructing said internal regulatory system with modified nominal operation parameters so as to use the electrochemical device with said modified nominal operation parameters, in view of lengthening said remaining useful life time.

5. The method of claim 1, wherein said prognostics data are estimated further on the basis of expected future environment data.

6. The method of claim 1, wherein, said electrochemical device comprising at least one fuel cell having a fuel canal, said measurements include a monitoring of variations of voltage provided by the fuel cell, and said internal regulatory system comprises an air bleed inlet in the fuel canal so as to evacuate contaminant from the fuel canal if a decrease of an average voltage value is observed from said measurements.

7. The method of claim 1, wherein, said electrochemical device comprising at least one fuel cell having an oxidant canal, said measurements include a pressure loss measurement in said oxidant canal, sensed by one or several sensors provided in said oxidant canal, and said internal regulatory system comprises a moisture controller in said oxidant canal so as to:

dry the oxidant canal if pressure loss is detected as being higher than a first threshold, and humidify the oxidant canal if pressure loss is detected as being lower than a second threshold.

8. The method of claim 7, wherein, said electrochemical device comprising at least one fuel cell having the fuel canal, said measurements include further a monitoring of variations of voltage provided by the fuel cell, and said internal regulatory system comprises an air bleed inlet in the fuel canal so as to evacuate a contaminant from the fuel canal if a decrease of an average voltage value is observed from said measurements, while said pressure loss is detected as being between said first and second thresholds.

9. A non-transitory computer storage medium storing a computer program comprising instructions to implement the method according to claim 1, when said instructions are run by a computer processor.

10. A computer control unit comprising at least an input interface to receive measurements, a processor and at least a memory unit to perform the method according to claim 1, and an output interface to provide operation instructions to control at least one internal regulatory system of an electrochemical device.

11. An electrochemical device including at least one sensor connected to the computer control unit according to claim 10, and at least one internal regulatory system connected to the computer control unit to operate the electrochemical device on the basis of operating instructions provided by the computer control unit.

* * * * *